(12) United States Patent
Hwang et al.

(10) Patent No.: US 10,998,607 B2
(45) Date of Patent: May 4, 2021

(54) HEAT DISSIPATING SHEET HAVING ANTENNA FUNCTION, AND PORTABLE TERMINAL INCLUDING THE SAME

(71) Applicant: AMOGREENTECH CO., LTD., Gimpo-si (KR)

(72) Inventors: Seung Jae Hwang, Incheon (KR); Beom-Jin Kim, Bucheon-si (KR); Min-Ho Won, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 109 days.

(21) Appl. No.: 15/743,278

(22) PCT Filed: Jul. 8, 2016

(86) PCT No.: PCT/KR2016/007457
§ 371 (c)(1),
(2) Date: Jan. 10, 2018

(87) PCT Pub. No.: WO2017/010755
PCT Pub. Date: Jan. 19, 2017

(65) Prior Publication Data
US 2018/0205131 A1    Jul. 19, 2018

(30) Foreign Application Priority Data

Jul. 10, 2015   (KR) .................. 10-2015-0098660
Aug. 26, 2015   (KR) .................. 10-2015-0120427

(51) Int. Cl.
*H01Q 1/02*   (2006.01)
*H05K 7/20*   (2006.01)
(Continued)

(52) U.S. Cl.
CPC ............ *H01Q 1/02* (2013.01); *H01Q 1/242* (2013.01); *H01Q 1/243* (2013.01); *H01Q 1/44* (2013.01);
(Continued)

(58) Field of Classification Search
CPC ..... H01Q 1/02; H05K 7/2039; H05K 7/20472
See application file for complete search history.

(56) References Cited

U.S. PATENT DOCUMENTS 8,905,317 B1 * 12/2014 Hsu .................. G06K 7/10356
                                                235/492
2001/0048397 A1 * 12/2001 Smith .................... H01Q 1/02
                                                343/702
(Continued)

FOREIGN PATENT DOCUMENTS

JP        2015-075782 A    4/2015
KR    10-2011-0090698 A    8/2011
(Continued)

*Primary Examiner* — William H. Mayo, III
*Assistant Examiner* — Rhadames Alonzo Miller
(74) *Attorney, Agent, or Firm* — Bayramoglu Law Offices LLC (57) ABSTRACT

A heat dissipating sheet having an antenna function, and a portable terminal including the same are provided. The heat dissipating sheet, having an antenna function, according to one embodiment of the present disclosure comprises: an antenna part formed into an antenna pattern having a predetermined line width; and a heat dissipating part disposed on the same plane as the antenna part, and dissipating heat transferred from a heat source or distributing locally concentrated heat, wherein the antenna part and the heat dissipating part are directly attached to an inner surface of a rear case or a back cover of a portable terminal body through a medium of an adhesive member.

16 Claims, 6 Drawing Sheets

(51) Int. Cl.
*H01Q 1/24* (2006.01)
*H01Q 1/44* (2006.01)
*H04M 1/02* (2006.01)

(52) U.S. Cl.
CPC .......... *H04M 1/026* (2013.01); *H05K 7/2039* (2013.01); *H05K 7/20472* (2013.01)

(56) References Cited

U.S. PATENT DOCUMENTS

| | | | | |
|---|---|---|---|---|
| 2005/0111194 A1* | 5/2005 | Sohn | .................... | H01L 23/3672 361/704 |
| 2006/0281500 A1* | 12/2006 | Huang | .................... | H01Q 1/243 455/575.1 |
| 2007/0096997 A1* | 5/2007 | Nishikawa | ............ | G06F 1/1616 343/702 |
| 2007/0176831 A1* | 8/2007 | Lagnado | ............... | G06F 1/1616 343/702 |
| 2008/0055861 A1* | 3/2008 | Nagareda | .............. | H01L 23/467 361/707 |
| 2008/0303121 A1* | 12/2008 | Lin | ....................... | H01L 23/367 257/664 |
| 2009/0096413 A1* | 4/2009 | Partovi | ................... | H01F 5/003 320/108 |
| 2009/0310311 A1* | 12/2009 | Kondoh | ................. | H04B 1/036 361/707 |
| 2010/0079344 A1* | 4/2010 | Rahm | ...................... | H01Q 1/44 343/702 |
| 2011/0235278 A1* | 9/2011 | Hara | .................... | H01L 23/3675 361/715 |
| 2014/0240179 A1* | 8/2014 | Kim | ...................... | H01P 11/001 343/702 |
| 2014/0273892 A1* | 9/2014 | Nourbakhsh | ........ | H04B 1/3827 455/90.3 |
| 2015/0123860 A1* | 5/2015 | Park | ....................... | H01Q 1/526 343/720 |
| 2016/0028154 A1* | 1/2016 | Baek | ...................... | H01Q 1/526 343/720 |
| 2016/0065144 A1* | 3/2016 | Jiang | ..................... | H01L 23/057 330/289 |
| 2016/0352376 A1* | 12/2016 | Shimizu | ............... | H04B 1/38 |
| 2016/0365618 A1* | 12/2016 | Kim | ...................... | H01Q 1/1207 |
| 2017/0330683 A1* | 11/2017 | Kumura | ................ | H01Q 7/06 |

FOREIGN PATENT DOCUMENTS

| | | | |
|---|---|---|---|
| KR | 20110090698 A | * | 8/2011 |
| KR | 10-2014-0031358 A | | 3/2014 |
| KR | 10-2014-0105327 A | | 9/2014 |
| KR | 10-2014-0132515 A | | 11/2014 |

* cited by examiner

HEAT DISSIPATING SHEET HAVING ANTENNA FUNCTION, AND PORTABLE TERMINAL INCLUDING THE SAME

CROSS REFERENCE TO RELATED APPLICATIONS

This application is the national phase entry of International Application No. PCT/KR2016/007457, filed on Jul. 8, 2016, which is based upon and claims priority to Korean Patent Applications 10-2015-0098660, filed on Jul. 10, 2015 and 10-2015-0120427, filed on Aug. 26, 2015. The entire contents of which are incorporated herein by reference.

TECHNICAL FIELD

The present disclosure relates to a heat dissipating sheet having an antenna function and a portable terminal including the same.

BACKGROUND

Among the wireless communication technologies, NFC is a non-contact type short-range wireless communication module using 13.56 MHz frequency band as one of the RFID tags, and it refers to a technology of transmitting data at a distance of 10 cm between terminals. NFC is widely used as a file transfer method such as transmission of goods information in supermarkets or in general shops or travel information for visitor, transportations, access control lock or the like, as well as a mobile payment.

This NFC technology is applied to portable terminals including mobile phone and tablet PC and the like as short distance information transmitting and receiving function based on a near field communication (NFC), and provides not only mobile payment but also the function of transmitting pictures, business cards, files, maps, websites, or the like, between portable terminals.

Such an NFC technology is usually performed by forming an NFC antenna through a pattern printed on one surface of a circuit board in a predetermined pattern. More specifically, the NFC antenna is manufactured by a method of forming an antenna pattern by etching a relatively expensive flexible copper clad laminated (FCCL) film, so there is a limit to the unit price reduction.

On the other hand, portable electronic devices such as smart phones, tablet PCs, laptops and the like have high performance, but the thickness of them becomes slimmer, thereby it is necessary to rapidly dissipate heat generated from various circuit components (for example, an AP chip) in the devices to prevent the electronic devices from being damaged by heat.

For this, a heat dissipating sheet is provided to dissipate heat energy generated inside the system to the outside. For example, the heat dissipating sheet is installed inside the portable electronic device so as to dissipate heat generated from the heat source.

Specifically, when the NFC antenna is applied to the portable terminal, the NFC antenna may be embedded in a battery pack, attached to a battery pack side, or attached to a battery cover side.

At this time, the heat dissipating sheet is disposed in the region excluding the region that the NFC antenna is disposed so as not to affect the NFC performance. Accordingly, the heat dissipating sheet must be disposed in a region excluding the region corresponding to the battery size so as not to overlap with the battery pack in which the NFC antenna is embedded. As a result, the heat-dissipating sheet can't secure a sufficient area due to restriction of the space by the NFC antenna, and there is a problem that heat dissipation performance is deteriorated.

Also, in an electronic device using an existing NFC antenna, because the NFC antenna and the heat dissipating sheet are stacked in the vertical direction, they are act as a factor that hinders the thinning of electronic devices. As a result, it is difficult to increase the thickness of the heat dissipating sheet to a predetermined thickness or more, and thus there is a limit to improving heat dissipation performance.

SUMMARY OF THE INVENTION

The present disclosure is directed to providing a heat dissipating sheet having an antenna function capable of implementing both a heat dissipation function and a function of the NFC antenna without using expensive FCCL material, and a portable terminal including the same.

Further, the present disclosure is directed to providing a heat dissipating sheet having an antenna function capable of improving heat dissipation performance by enlarging the entire heat dissipation region since the remaining region except for the region functioning as the antenna performs the function of the heat dissipating sheet, and a portable terminal including the same.

Furthermore, the present disclosure is directed to providing a heat dissipating sheet having an antenna function capable of realize thinning by disposing a part functioning as an antenna and a part functioning as a heat dissipating sheet on the same plane instead of being stacked in the vertical direction each other, and a portable terminal including the same.

On the other hand, the present disclosure is directed to providing a heat dissipating sheet having an antenna function capable of preventing deterioration and deformation of the antenna by heat and rapidly distributing locally concentrated heat by disposing a part functioning as an antenna and a part functioning as a heat dissipating sheet at optimum location with respect to a heat source, and a portable terminal including the same.

To achieve the above objects, the present disclosure provides a heat dissipating sheet having an antenna function including: an antenna part formed into an antenna pattern having a predetermined line width; and a heat dissipating part disposed on the same plane as the antenna part, and dissipating heat transferred from a heat source or distributing locally concentrated heat; wherein the antenna part and the heat dissipating part are directly attached to an inner surface of a rear case or a back cover of a portable terminal body through an adhesive member as a medium.

According to an exemplary embodiment of the present disclosure, the antenna part and the heat dissipating part may be configured of single thin plate member having an electric conductivity and a thermal conductivity. In this case, the thin plate member may be a copper foil or an aluminum foil.

Also, the antenna part and the heat dissipating part may be integrally connected, or are physically separated.

Also, a portion of an entire area of the thin plate member may be formed into an antenna pattern having a predetermined line width so as to be configured to the antenna part, and the remaining portions except for the portion may be configured to the heat dissipating part.

Also, the antenna part may serve as a near field communication (NFC) antenna for short-range wireless communication.

Also, the adhesive member may include a base material of film type, and an adhesive layer disposed at least on one surface of the base material, and the adhesive member may be an adhesive of a liquid-type or a gel-type.

Also, the antenna part may include a first pattern portion disposed to surround an outside of the heat dissipating part, and a second pattern portion formed in an inner region of the heat dissipating part, the first pattern portion and the second pattern portion may be integrally connected.

Also, the heat dissipating part may include a first dissipating part disposed in an inner region of the antenna pattern, and a second dissipating part disposed in an outer region of the antenna pattern.

Also, a shielding member may be disposed in a region corresponding to the antenna part to improve antenna performance.

Also, the heat dissipating sheet may further include a supporting member provided on one surface of the adhesive member, and wherein a total area of the supporting member may include a total area of the antenna part and the heat dissipating part, and the antenna part and the heat dissipating part are integrated with the supporting member through the adhesive member as a medium.

Also, the supporting member may be one selected from among a polyimide (PI) film, a poly ethylene terephthalate (PET) film, and a bonding sheet.

Also, a pattern portion of the antenna part may be disposed in a region except for a portion directly above a heat source, and the heat dissipating part may be disposed in a region including the portion directly above the heat source.

Also, an auxiliary heat dissipating member may be disposed on one surface of the heat dissipating part to improve heat dissipation performance, and the auxiliary dissipating member may include at least one selected from among graphite, copper, and aluminum.

Also, a line width of the antenna pattern may range from 0.5 mm to 1.2 mm, and an interval between neighboring the antenna patterns may range from 0.4 mm to 1 mm.

On the other hand, the present disclosure provides a heat dissipating sheet having an antenna function including: a thin plate member having an electric conductivity and a thermal conductivity; and a near field communication (NFC) antenna formed with an antenna pattern having a predetermined line width so that an area of an entire area of the thin plate member can serve as an antenna for wireless communication; and wherein the remaining area except for the area that the NFC antenna is formed among the entire area of the thin plate member performs heat dissipation functions to dissipate heat transferred from a heat source or to distribute a locally concentrated heat.

Also, the heat dissipating sheet having an antenna function described above may be included in a portable terminal.

According to the present disclosure, even if the expensive FCCL material is not used, both of the heat dissipation function and the function of the NFC antenna can be implemented, so the production cost can be lowered to realize a low cost product.

Also, the present disclosure can improve heat dissipation performance by enlarging the entire heat dissipation region since the remaining region except for a region functioning as the antenna serves as the heat dissipating sheet.

In addition, the present disclosure can realize thinning by disposing a part functioning as an antenna and a part functioning as a heat dissipating sheet on the same plane instead of being stacked in the vertical direction.

On the other hand, the present disclosure can prevent deterioration and deformation of the antenna and can rapidly distribute locally concentrated heat by disposing a part functioning as a heat dissipating sheet and a part functioning as an antenna at optimum location with respect to a heat source.

DETAILED DESCRIPTION OF THE INVENTION

Hereinafter, embodiments of the present disclosure will be described in detail with reference to the accompanying drawings so that those skilled in the art may easily carry out the present disclosure. The present disclosure may be embodied in various ways and is not to be construed as limited to the embodiments described herein. In the drawings, parts not relating to the description may be omitted for the clarity of description, and the same reference numerals may be used to designate the same or similar elements throughout the specification.

Figure 1:
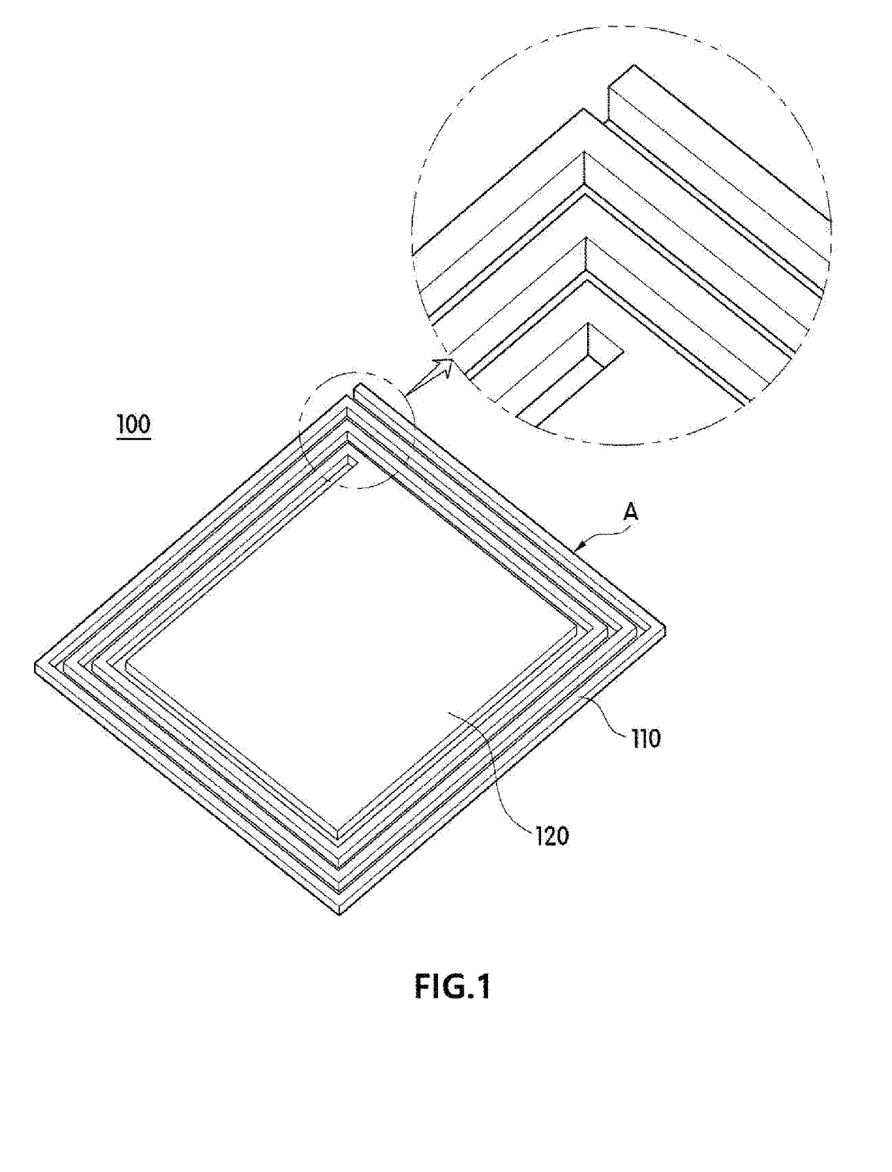
FIG. 1 is a schematic view illustrating a heat dissipating sheet having an antenna function according to an embodiment of the present disclosure, in which an antenna pattern and a heat dissipating part are integrally formed.
Figure 2:
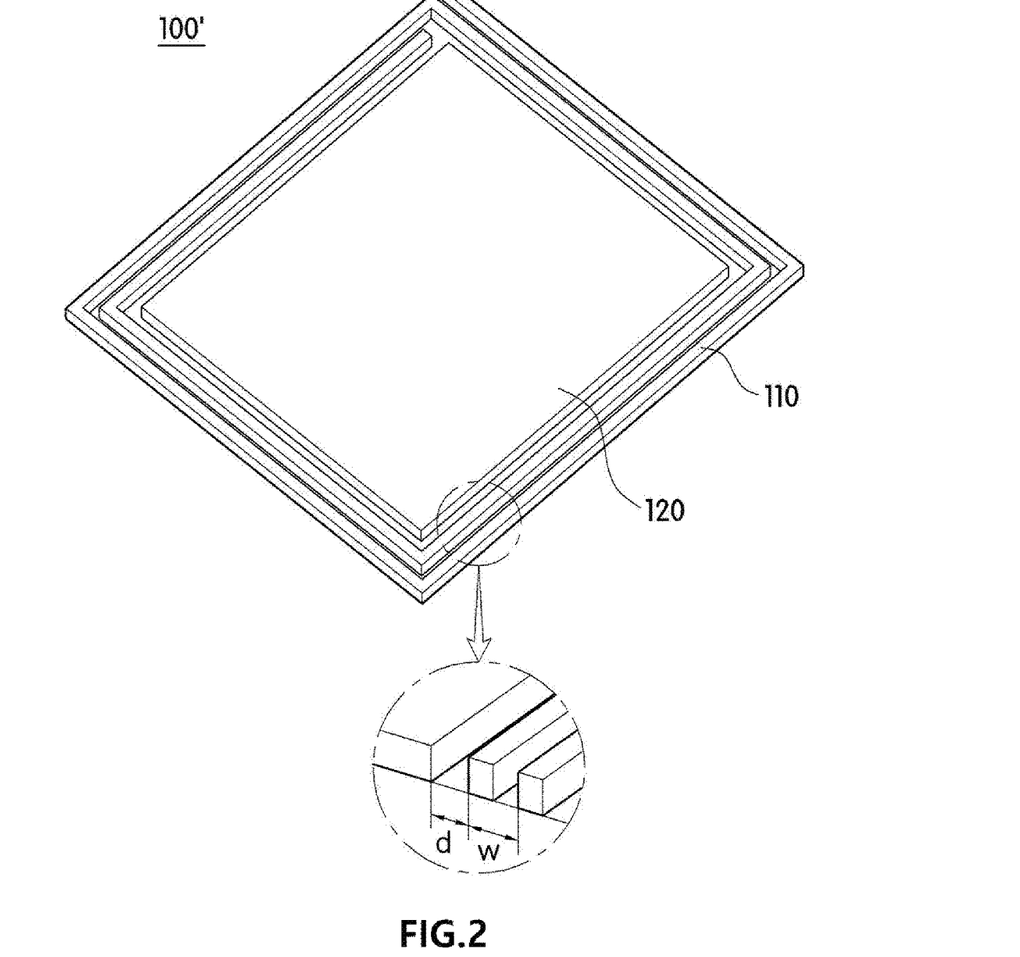
FIG. 2 is a schematic view illustrating a heat dissipating sheet having an antenna function according to an embodiment of the present disclosure, in which an antenna pattern and a heat dissipating part are separately formed.

As illustrated in FIGS. 1 and 2, a heat dissipating sheet 100, 100' having an antenna function according to an embodiment of the present disclosure includes an antenna part and a heat dissipating part 120.

The antenna part serves as an antenna that performs a predetermined function in a wireless manner using a corresponding frequency band, and is formed into a predetermined antenna pattern 110.

For example, the antenna part may serve as a near field communication (NFC) antenna transmitting various data such as photo, business card, file, map, and the like using mobile payment or a file transmitting method, to different electronic devices by transmitting and receiving information based on wireless communication.

However, the function of the antenna part is not limited to this above, the antenna part may serve as a magnetic secure transmission (MST) antenna for magnetic security payment or a wireless power transfer (WPT) antenna for wireless power transfer.

Such an antenna pattern 110 may be formed to have a predetermined pattern through laser processing or etching in a state that a metal sheet (for example, a copper foil) is attached to one surface of a separate member (for example, a supporting member 140), be printed using conductive ink on one surface of the member, or be formed that the metal sheet has a fine line width by being punched through a punching process.

Here, a line width W of the antenna pattern 110 may be formed to have a that of 0.5 mm to 1.2 mm and an interval (or spacing) d between neighboring patterns each other may be formed to have a that of 0.2 mm to 1 mm. However, the line width and the interval are not limited thereto, and may have various widths and intervals depending on the design conditions and the functions as a desired antenna.

In this case, the antenna pattern 110 may be disposed to be located in a region except for a portion directly above a heat dissipation component which is a heat source. For example, when the antenna pattern 110 is attached to a back cover 92 or a rear case of a portable terminal, the antenna pattern 110 may be attached to the back cover 92 or the rear case so that the antenna pattern 110 is not disposed in the region directly above an application processor (AP) chip embedded in the portable terminal body 90.

This above is to prevent from deformation or damage of the antenna pattern 110 by heat, or performance deterioration of the antenna pattern 110 performing as an antenna when the heat generated from the AP chip, which is a heat source, is transmitted to the antenna pattern 110 side.

The heat dissipating part 120 is disposed between the heat dissipation component which is the heat source and the other component in the portable terminal such as mobile phone, personal digital assistants (PDA), portable multimedia player (PMP), tablet, multimedia device, or the like so as to dissipate the heat generated from the heat dissipation component.

For example, the heat dissipating part 120 may be interposed between a heat dissipation component (for example, the AP chip) embedded in the portable terminal body 90 and a battery cover 92 so that the heat dissipating part 120 may rapidly distribute heat generated from the heat dissipation component, thereby prevent heat from being locally concentrated.

Such a heat dissipating part 120 may be formed in a bar having a predetermined length or in a film or a sheet having a predetermined area.

In this case, the heat dissipating part 120 may be made of a material having excellent thermal conductivity. For example, the heat dissipating part 120 may be formed of a plate-shaped member having excellent thermal conductivity such as copper, aluminum, graphite, and the like or be formed of an alloy of two or more metal materials including copper, aluminum, and the like.

Accordingly, since the heat dissipating part 120 quickly dissipates the heat generated from the heat dissipation component and prevents locally high heat from being generated, the heat dissipating part 120 may prevent the heat dissipation component from being damaged by heat or prevent the heat from being transmitted to another component.

In this case, a heat dissipating sheet 100, 100' having an antenna function according to the present disclosure may serve as both the described-above antenna and heat dissipating part.

For this above, a heat dissipating sheet 100 having an antenna function according to the present disclosure may be formed with the antenna pattern 110 functioning as an antenna in a portion of the entire area of a thin plate member A having electric conductivity and thermal conductivity.

Through this above, a region formed the antenna pattern 110 in the thin plate member functions as an antenna, the remaining region excluding the region that the antenna pattern 110 is formed in the thin plate member functions as a heat dissipating sheet which dissipates heat transmitted from the heat source or distributes heat locally.

Here, the thin plate member may be made of a metal material having electrical conductivity and thermal conductivity, for example, a copper foil or an aluminum foil. However, the thin plate member is not limited thereto, may be used any material having electrical conductivity and thermal conductivity.

In this case, the heat dissipating sheet 100, 100' having an antenna function according to the present disclosure may have a structure in which the antenna pattern 110 performing the function of an antenna and the heat dissipating part 120 performing the heat dissipation function are integrally connected to each other (refer to FIG. 1), or have a structure in which the antenna pattern 110 and the heat dissipating part 120 are physically separated from each other (refer to FIG. 2).

Here, in a case in which the heat dissipating part 120 and the antenna pattern 110 are physically separated, the materials of the member constituting the heat dissipating part 120 and the member constituting the antenna pattern 110 may be made of same materials or different materials. For example, the antenna pattern 110 may be made of a copper foil or an aluminum foil, and the heat dissipating part 120 may be made of any one selected from among copper, aluminum, and graphite having thermal conductivity, or may be made of a mixture thereof.

In this case, the heat dissipating sheet 100, 100' having an antenna function according to the present disclosure may have a total thickness of 80 μm to 130 μm, may have a thickness of 100 μm. In a case in which a protective film 160 is attached to one surface of the antenna pattern 110 and the heat dissipating part 120 through an adhesive layer 162 as a medium, the total thickness of the heat dissipating sheet 100, 100' may be the sum of the thicknesses of the protective film 160 and the adhesive layer 162.

Here, the total thickness of the heat dissipating sheet 100, 100' having an antenna function is exemplified as 80 μm to 130 μm, however, it should be understood that the total thickness of the heat dissipating sheet is thin, and the total thickness of the heat dissipating sheet is not limited thereto.

On the other hand, in the heat dissipating sheet 100, 100' having an antenna function according to the present disclosure, the antenna pattern 110 and the heat dissipating part 120 may be disposed on the same plane.

For example, in a case in which the antenna pattern 110 is formed on a portion of the thin plate member and the antenna pattern 110 and the heat dissipating part 120 are integrally connected to each other, since the antenna pattern 110 and the heat dissipating part 120 are respectively formed through a single member, the antenna pattern 110 and the heat dissipating part 120 form the same plane.

As another example, in a case in which the antenna pattern 110 and the heat dissipating part 120 are physically separately formed from each other, since the antenna pattern 110 and the heat dissipating part 120 is attached in a line on a mounting surface which is the same plane through the adhesive member 130 as a medium, the antenna pattern 110 and the heat dissipating part 120 may be disposed on the same plane. In addition, in a case in which the antenna pattern 110 and the heat dissipating part 120 are physically separately formed from each other, since the antenna pattern 110 and the heat dissipating part 120 are disposed in a line on one surface of a supporting member 140 having a predetermined area and one surface of the supporting member 140 is attached to a mounting surface which is the same plane, the antenna pattern 110 and the heat dissipating part 120 may be disposed on the same plane.

Accordingly, the heat dissipating sheets 100 and 100' having the antenna function according to the present disclosure may reduce the total thickness since the antenna pattern 110 and the heat dissipating part 120 are arranged in a line to each other without being stacked, in the case of manufacturing with the same thickness as the conventional thickness, both of antenna performance and heat dissipation performance may be improved because the thickness of the antenna pattern 110 and the heat dissipating part 120 may be increased.

In the present disclosure, the supporting member 140 may be a fluorine resin-based film sheet such as polyimide (PI), poly ethylene terephthalate (PET) or the like, which is a thermosetting polymer resin, or may be a known silicon-based bonding sheet, or may be a double-sided tape. However, the type of the supporting member is not limited thereto, and any member capable of supporting the antenna pattern 110 and the heat dissipating part 120 may be used.

Figure 3:
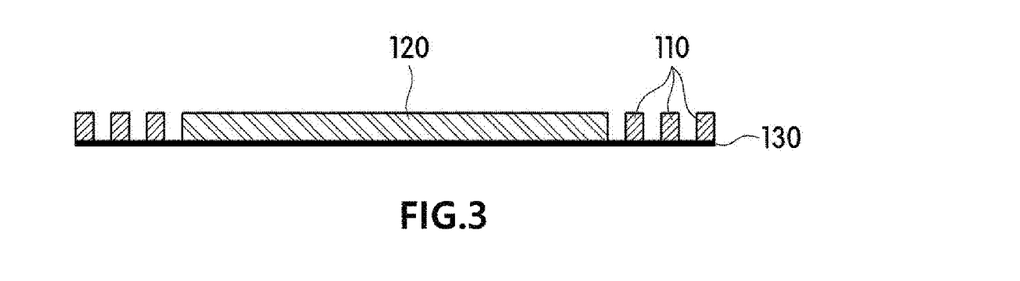
FIG. 3 is a cross-sectional view illustrating a heat dissipating sheet having an antenna function according to an embodiment of the present disclosure.
Figure 6:
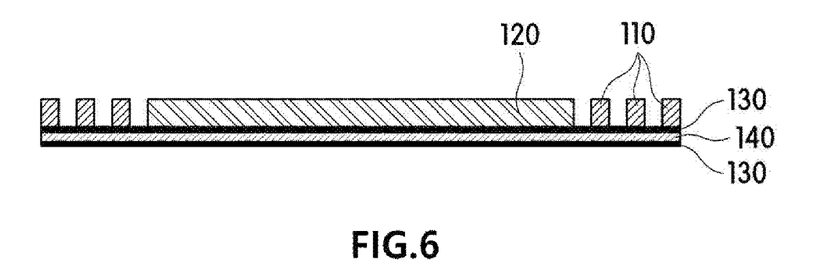
FIG. 6 is a cross-sectional view illustrating a heat dissipating sheet having an antenna function according to the present disclosure, which includes a supporting member.

On the other hand, the heat dissipating sheet 100, 100' having an antenna function according to the present disclosure may include an adhesive member 130 having a tackiness or adhesive property (refer to FIG. 3), the antenna part and the heat dissipating part 120 may include a plate-shaped supporting member 140 attached through the adhesive member 130 as a medium (refer to FIG. 6).

Through this above, the antenna part and the heat dissipating part 120 may be integrated with the support member 140 in a state that the antenna part and the heat dissipating part 120 are disposed on the same plane since the location of the antenna part and the heat dissipating part 120 are respectively fixed on one surface of the supporting member 140 through a medium of the adhesive member 130. Specifically, in a case in which the antenna part and the heat dissipating part 120 are physically separated from each other, the antenna part and the heat dissipating part 120 may be integrated with the support member 140 in a state that the antenna part and the heat dissipating part 120 are disposed on the same plane since the location of the antenna part and the heat dissipating part 120 are respectively fixed through the adhesive member 130 as a medium.

Here, the adhesive member 130 may be provided in the form of an adhesive of a liquid-type or gel-type, or may be provided in the form including a film type base material and an adhesive which is applied to both surfaces of the film type base material.

In addition, in a case in which the adhesive member 130 includes the film type base material and the adhesive which is applied to both surfaces of the film type base material, the adhesive member 130 may replace the support member 140.

In this case, when the antenna part and the heat dissipating part 120 are separately formed from each other, the heat dissipating part 120 may be disposed in an region excluding the area that the antenna part is disposed in the entire area of the support member 140, more particularly, an remaining region excluding the region that the antenna pattern 110 constituting the antenna part is disposed.

Figure 4:
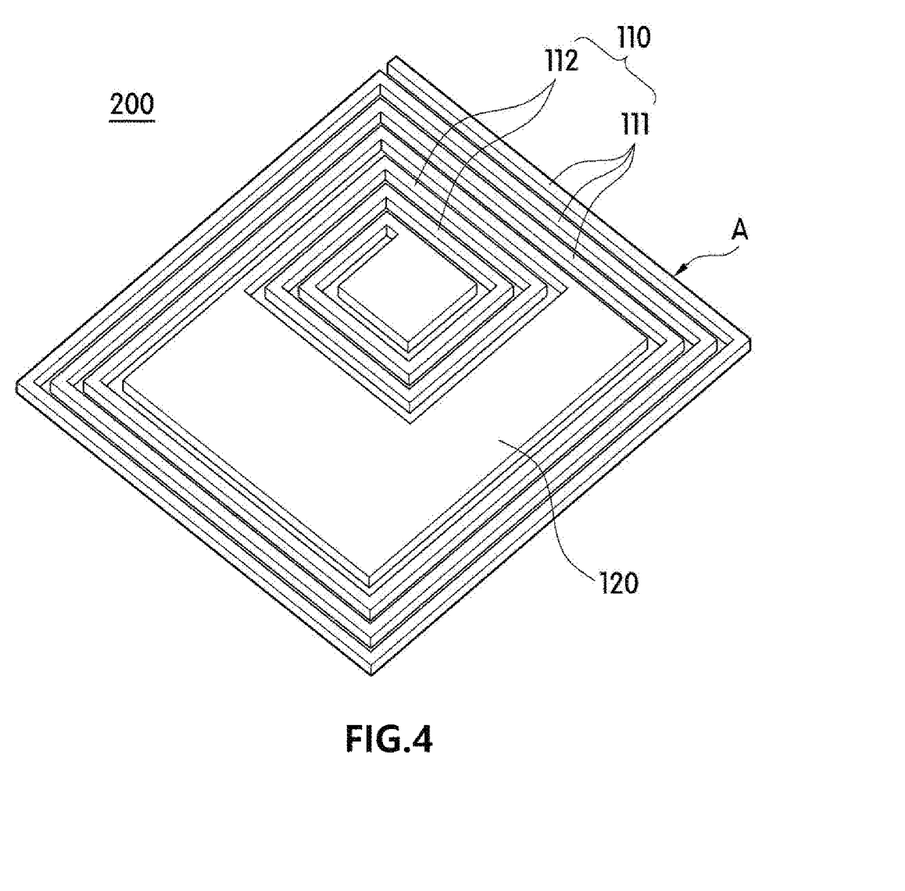
FIG. 4 is a schematic view illustrating a heat dissipating sheet having an antenna function according to another embodiment of the present disclosure, in which an antenna pattern is formed with a first pattern portion and a second pattern portion.

For example, as illustrated in FIGS. 1, 2 and 4, the antenna part may be disposed to surround the edge of the heat dissipating part 120 having a predetermined area. In this case, the heat dissipating part 120 may be disposed to include a portion directly above a heat dissipation component such as an AP chip.

Through this above, since the heat dissipating part 120 having a large area is disposed on directly above the heat dissipation component, the heat dissipating part rapidly distributes heat transmitted from the heat dissipation component, thereby prevents heat from being locally concentrated.

On the other hand, the antenna part may be formed at various locations with respect to the heat dissipating part 120.

Figure 5:
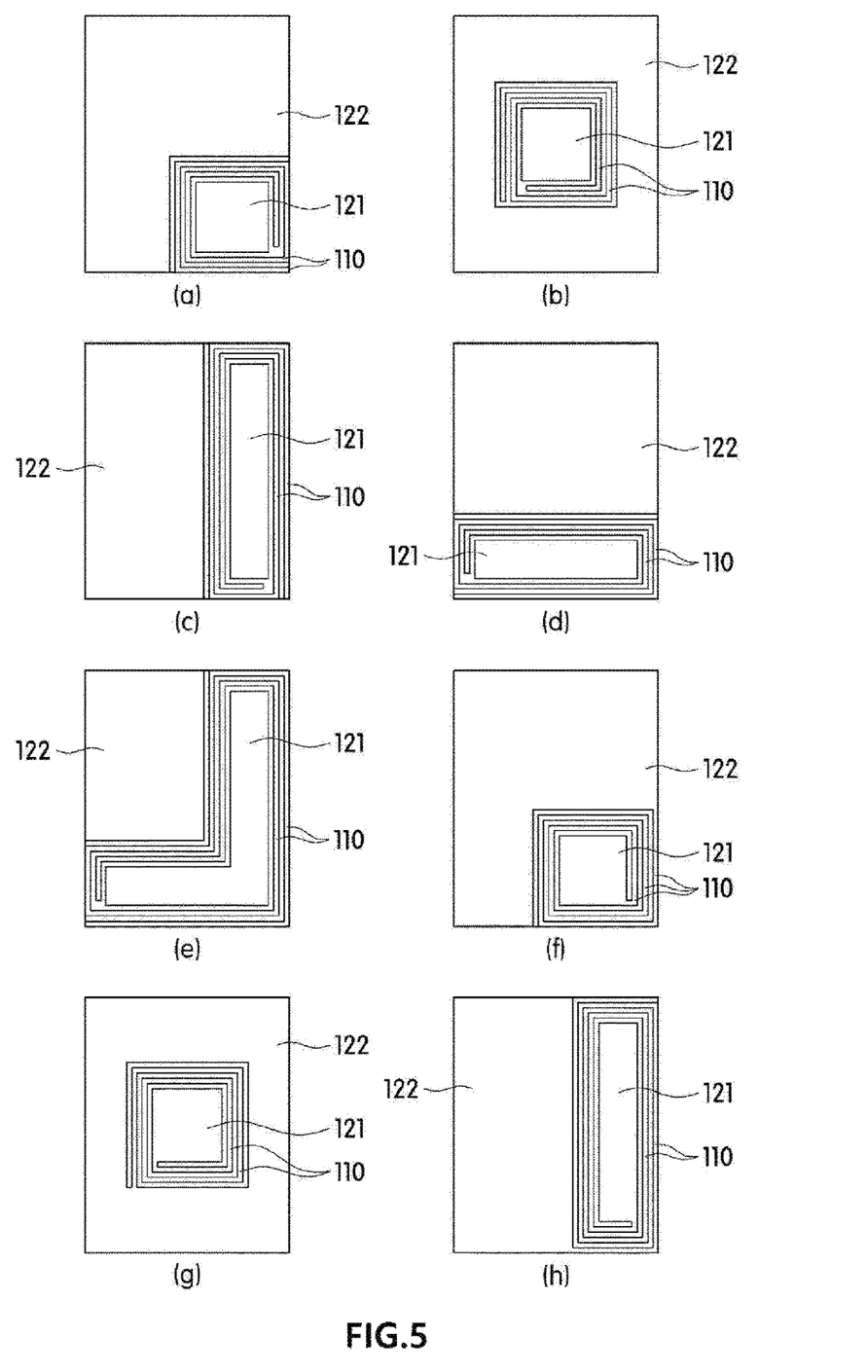
FIG. 5 is a plan view illustrating various disposition relationship of a heat dissipating part and an antenna pattern applied to a heat dissipating sheet having an antenna function according to the present disclosure.

For example, in a case in which the antenna pattern 110 functioning as an antenna and the heat dissipating part 120 providing a heat dissipation function are integrally formed by directly forming the antenna part on the thin plate member A, the antenna pattern 110 may be locally formed in a region of the entire area of the thin plate member A (refer to FIGS. 5F, 5G and 5H). Here, the remaining region of the entire area of the thin plate member A excluding the antenna pattern 110 functions as a heat dissipating sheet.

In addition, in a case in which the antenna part and the heat dissipating part 120 are separately formed by separate member, the antenna part may be locally disposed in a region of the entire area of the supporting member 140, the heat dissipating part 120 may include a first heat dissipating part 121 disposed in an inner region of the antenna pattern 110 and a second heat dissipating part 122 disposed in an outer region of the antenna pattern 110 (refer to FIGS. 5A to 5E).

In this way, it is intended to prevent the function as an antenna from being deteriorated or to prevent the antenna pattern 110 from being damaged by heat transmitted from the heat source since the degree of freedom of design of the antenna part is secured such that the antenna pattern 110 constituting the antenna part is not located directly above the heat dissipation component but is located in a region excluding directly above the heat dissipation component when the heat dissipation component is located on the rim side of the thin plate member A or on the rim side of the supporting member 140.

In addition, the maximum heat dissipation area may be secured since the heat dissipating part 120 is disposed in both the inner region and outer region of the antenna pattern 110 constituting the antenna part. Here, the heat dissipation component may be a heat dissipation component except for a battery.

For example, the antenna part may be disposed to be biased to a edge side of the supporting member 140 or the thin plate member A (refer to FIGS. 5A and 5F), may be disposed to be located at the center portion of the supporting member 140 or the thin plate member A (refer to FIGS. 5B and 5G). In addition, the antenna part is disposed only in a region of the support member 140 or the thin plate member A in the width direction or in the length direction so as to have a width or length substantially equal to the width or length of the support member 140 or the thin plate member A (refer to FIGS. 5C, 5D and 5H), or may be provided in mutually combined form thereof (refer to FIG. 5E).

However, the disposition relationship of the antenna part and the heat dissipating part 120 is not limited thereto, but may be changed to an appropriate location according to design conditions. There is no problem as long as the pattern portion of the antenna pattern 110 is not disposed directly above the heat dissipation component.

In addition, as illustrated in FIG. 4, in the heat dissipating sheet 200 having an antenna function according to the present disclosure, the antenna pattern 110 constituting the antenna part may include a first pattern portion 111 and a second pattern portion 112. In other words, the first pattern portion 111 may be disposed to surround the outside of the heat dissipating part 120 and the second pattern portion 112 may be pattern-formed in a predetermined number of turns in an inner region of the heat dissipating part 120.

For example, in a case in which the heat dissipating sheet 200 is embedded in a portable terminal and the antenna part serves as an NFC antenna, since data may be exchanged not only through the first pattern portion 111 but also through the second pattern portion 112 when the reader and the portable terminal are in contact with each other, the convenience of the user may be improved by extending the recognition range of the reader.

Here, the second pattern portion 112 formed in the inner region of the heat dissipating part 120 may be formed of a plurality of turns of one turn or more, the first pattern portion 111 and the second pattern portion 112 may be connected to each other through the heat dissipating part 120 as a medium.

Figure 7:
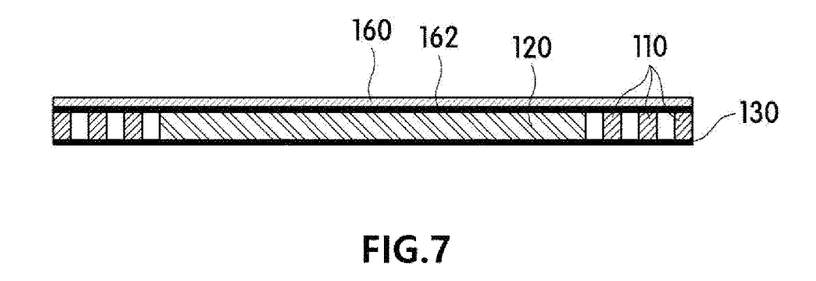
FIG. 7 is a cross-sectional view illustrating a heat dissipating sheet having an antenna function according to the present disclosure, which includes a protective film.

On the other hand, as illustrated in FIG. 7, the heat dissipating sheet 100, 100', 200 having an antenna function according to the present disclosure may include a colored protective film 160 for preventing the antenna part and the heat dissipating part 120 from being exposed to the outside. Such a protective film 160 may be attached so as to cover both the antenna part and the heat dissipating part 120 through an adhesive layer 162 as a medium.

Through his above, since the antenna part and the heat dissipating part 120 are prevented from being exposed to the outside through the protective film 160, oxidation by contact with air or moisture may be prevented, the antenna part and the heat dissipating part 120 may be protected from the external environment.

Figure 8:
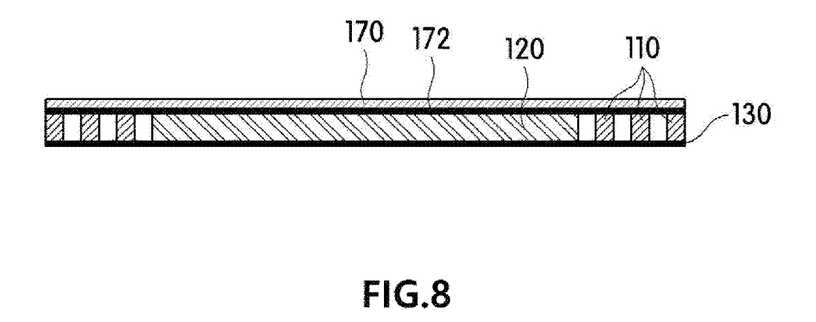
FIG. 8 is a cross-sectional view illustrating a heat dissipating sheet having an antenna function according to the present disclosure, which includes a shielding member.

In addition, as illustrated in FIG. 8, the heat dissipating sheet 100, 100', 200 having an antenna function according to the present disclosure may include a shielding member 170 for shielding a magnetic field generated by the antenna part and focusing in a desired direction on one surface of the antenna part and the heat dissipating part 120.

Such a shielding member 170 above may be used a sheet made of a magnetic material such as ferrite, polymer, a ribbon sheet including amorphous alloy or nano-crystal alloy, or may be used a ferrite polymer sheet obtained by mixing ferrite powder and hot-melt rubber. Since such a ferrite polymer sheet is a shield member manufactured using waste powder generated in the process of manufacturing a ferrite sheet, resource recycling and cost reduction may be achieved.

That is, the ferrite polymer sheet is produced by pulverizing the discarded ferrite powder and mixing an appropriate amount of a commonly used adhesive with the hot-melt rubber. Such a ferrite polymer sheet has a low magnetic permeability of 50 or less, however, in a case in which the heat dissipating sheet 100, 100', 200 according to the present disclosure is applied to an electronic device such as a mobile phone and the heat dissipating sheet is installed to partially overlap with a battery or metal part, even if a shielding member having the low magnetic permeability is disposed, an antenna may realize sufficient characteristics.

Figure 9:
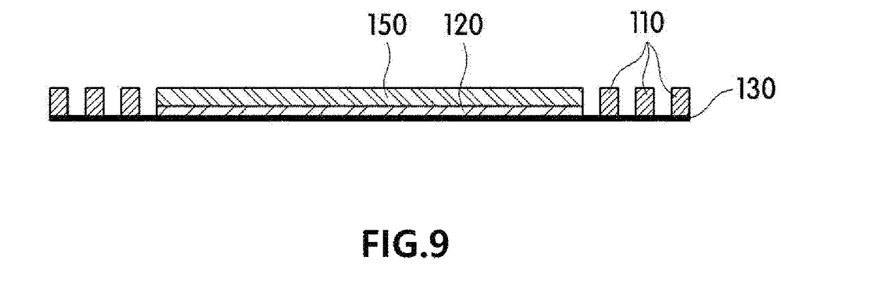
FIG. 9 is a view illustrating a heat dissipating sheet having an antenna function according to the present disclosure, which includes an auxiliary heat dissipating member.

On the other hand, as illustrated in FIG. 9, in the heat dissipating sheet 100, 100', 200 having an antenna function according to the present disclosure, a separate auxiliary heat dissipating member 150 may be stacked on one surface of the heat dissipating part 120 to improve heat dissipation performance of the heat dissipating part 120.

In this case, the auxiliary heat dissipating member 150 may have a thermal conductivity higher than the thermal conductivity of the heat dissipating part 120, thereby may improve heat dissipation performance. Here, the auxiliary heat dissipating member 150 may be provided in the form of a film, a bar, or a sheet.

For example, the auxiliary heat dissipating member 150 may be any one of graphite, copper, or aluminum, and may be provided in mutually combined form thereof. In addition, the auxiliary heat dissipating member 150 may be a plate-shaped member or may be provided in a web in which a metal material including at least one of aluminum and copper is stacked, or may be entirely provided or partially provided on one surface of the heat dissipating part 120.

In a case in which the auxiliary dissipating member 150 is attached to one surface of the heat dissipating part 12, a thickness of the sum of the heat dissipating part 120 and the auxiliary heat dissipating member 150 may be a thickness of 100 μm or more, or may be a thickness of 50 μm to 100 μm.

That is, in a case in which the auxiliary dissipating member 150 is stacked on one surface of the heat dissipating part 120, since the thickness of the heat dissipating part 120 having a relatively low thermal conductivity is formed thin and the thickness of the auxiliary heat dissipating member 150 having a relatively high thermal conductivity is formed thick, it may be formed so that the total heat dissipation performance is increased but the total thickness of the heat dissipating sheet 100, 100', 200 is not increased.

Through this above, although the heat dissipating sheets 100, 100', 200 having an antenna function are configured to the same thickness, a further improved heat dissipation performance may be obtained through the combination of the heat dissipating part 120 and the auxiliary heat dissipating member 150.

Such a heat dissipating sheet 100, 100', 200 having an antenna function may be manufactured through an etching process. For example, the antenna pattern 110 having a predetermined line width is etched on the thin plate member A through an etching process in a state that the thin plate member A having electrical conductivity and thermal conductivity is attached to one surface of the supporting member 140, thereby the heat dissipating sheet may be manufactured so that a part which the antenna pattern 110 is formed serves as an antenna part and the remaining part serves as the heat dissipating part 120.

Here, in the etching process, the thin plate member A may be etched so that the antenna pattern 110 and the heat dissipating part 120 are physically separated from each other, or the antenna pattern 110 and the heat dissipating part 120 may be connected to each other.

In addition, the manufacturing method of the heat dissipating sheet 100, 100', 200 having an antenna function according to the present disclosure is not limited thereto, the heat dissipating sheet may be processed to serve as the antenna part and the heat dissipating part 120 by forming an antenna pattern 110 on one surface of the support member through laser processing in a state that the thin plate member A having electrical conductivity and heat conductivity is attached to one surface of the supporting member, may be manufactured by printing the antenna pattern 110 and the heat dissipating part 120 on one surface of the supporting member. In addition, the heat dissipating sheet may be formed by integrally punching the antenna pattern 110 and the heat dissipating part 120 and may be formed by separately punching the antenna pattern 110 and the heat dissipating part 120.

Figure 10:
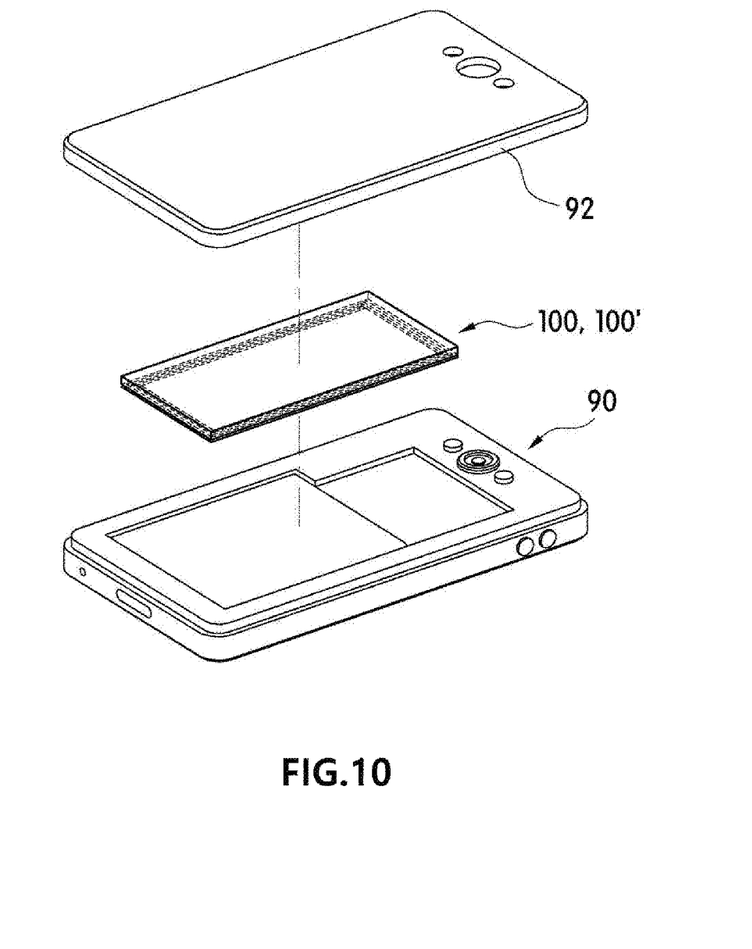
FIG. 10 is an exemplary view illustrating a state in which a heat dissipating sheet having an antenna function according to an embodiment of the present disclosure is attached to a back cover of a portable terminal.

As illustrated in FIG. 10, the heat dissipating sheet 100, 100', 200 having an antenna function according to an embodiment of the present disclosure may be installed on the inner surface of a rear case or a back cover 92 of the terminal body 90 in the portable terminal.

That is, the heat dissipating sheet 100, 100', and 200 having the antenna function according to the present disclosure may be attached to the inner surface of the rear case or the back cover 92 of the terminal body 90 through the adhesive member 130 disposed on one surface of the supporting member 140.

Through this above, it is possible to prevent the heat generated from the heat dissipating component from being transmitted to the user's hand through the back cover to cause burns or unpleasant feeling in use when the user wraps the back cover portion of a portable terminal by hand.

In addition, in a case in which the heat dissipating sheet 100, 100', 200 having an antenna function according to the embodiment of the present disclosure described above is mounted on the portable terminal, the heat dissipating sheet may rapidly distribute heat generated from the heat dissipating component which is a heat source through the heat dissipating part 120, thereby may minimize the thermal influence applied to the internal components of the portable terminal.

Here, the portable terminal includes a terminal body 90 for performing a function of the portable terminal; and a rear case or a back cover 92 disposed on the rear surface of the terminal body. The terminal body includes the rear surface having the regions that battery, memory chip, or the like, may be mounted. The back cover 92 may be detachably coupled to the rear surface of the terminal body 90 for convenience of replacement and for the aesthetics of the portable terminal. Here, the back cover 92 may be referred to as a battery cover.

On the other hand, the heat dissipating sheet 100, 100', 200 having an antenna function according to the present disclosure may be directly attached to the inner surface of the rear case or the back cover 92 through the adhesive member 130 disposed on one surface of the antenna part and the heat dissipating part 120 without using the supporting member 140.

That is, the dissipating sheets 100, 100', 200 having the antenna function according to the present disclosure may be directly attached to the inner surface of the rear case or the back cover 92 through an adhesive of a liquid-type or a gel-type so that the antenna part is coplanar with the heat dissipating part 120.

In addition, in a case in which the adhesive member 130 is provided in the form of a base material type including a film type base material and an adhesive layer in which is disposed on both surfaces of the film type base material, for example, a double-sided tape, the antenna part and the heat dissipating part 120 may be integrated with the base material through an adhesive layer disposed on one surface of the base material and may be directly attached to the rear case or the back cover 92 through an adhesive layer disposed on the opposite surface of the base material. In such a case, the base material may replace the role of the supporting member 140 described above.

Although exemplary embodiments of the present disclosure have been described, the exemplary embodiments described in the specification are intended to not limit the technical spirit of the present disclosure, and A person having ordinary skills in the art who understands the spirit of the present disclosure should appreciate that another embodiment may be easily suggested by additions, modifications, deletions, supplements, and the like made within the scope of the same spirit, and the other embodiment also may be included within the scope and sprit of the present disclosure.

The invention claimed is:

1. A heat dissipating sheet having an antenna function, comprising:
   an antenna part formed into an antenna pattern having a predetermined line width; and a heat dissipating part disposed on a same plane as the antenna part, and dissipating heat transferred from a heat source or distributing locally concentrated heat,
   wherein the antenna part and the heat dissipating part are attached to an inner surface of a rear case or a back cover of a portable terminal body through an adhesive member,
   wherein the heat dissipating part includes first and second heat dissipating parts, and the antenna pattern comprises a shape in the form of a square or rectangle, the shape is repeated in decreasing increments equal to the predetermined line width to define a plurality of the shapes each disposed inside another,
   wherein the antenna part is disposed to surround an edge of the heat dissipating part or the antenna part is disposed at various locations relative to the heat dissipating part or the antenna part is locally disposed in a region of an entire area of the heat dissipating part.

2. The heat dissipating sheet of claim 1, wherein the antenna part and the heat dissipating part are formed of a single thin plate member, wherein the single thin plate member is electrically and thermally conductive.

3. The heat dissipating sheet of claim 2, wherein the single thin plate member is a copper foil or an aluminum foil.

4. The heat dissipating sheet of claim 2, wherein the antenna part and the heat dissipating part are integrally formed.

5. The heat dissipating sheet of claim 2, wherein a portion of an entire area of the single thin plate member is formed into the antenna pattern having a predetermined line width so as to define the antenna part, and the remaining portion of the single thin plate member defines the heat dissipating part.

6. The heat dissipating sheet of claim 1, wherein the antenna part serves as a near field communication (NFC) antenna for short-range wireless communication.

7. The heat dissipating sheet of claim 1, wherein an adhesive layer is disposed on at least one surface of a base material, and the adhesive member includes the base material of a film type.

8. The heat dissipating sheet of claim 1, wherein the adhesive member is a liquid-type or a gel-type adhesive.

9. The heat dissipating sheet of claim 1, wherein a shielding member is disposed in a region corresponding to the antenna part to improve antenna performance.

10. The heat dissipating sheet of claim 1, wherein a supporting member is provided with the adhesive member, wherein a total area of the supporting member is equal to a total area of the antenna part and the heat dissipating part, wherein the antenna part and the heat dissipating part are integrated with the supporting member through the adhesive member as a medium.

11. The heat dissipating sheet of claim 10, wherein the supporting member is one selected from the group consisting of a polyimide (PI) film, a poly ethylene terephthalate (PET) film, and a bonding sheet.

12. The heat dissipating sheet of claim 1, wherein an auxiliary heat dissipating member is disposed on one surface of the heat dissipating part to improve heat dissipation performance.

13. The heat dissipating sheet of claim 12, wherein the auxiliary heat dissipating member includes at least one selected from the group consisting of a graphite, a copper, and an aluminum.

14. The heat dissipating sheet of claim 1, wherein the line width of the antenna pattern ranges from 0.5 mm to 1.2 mm.

15. The heat dissipating sheet of claim 1, wherein an interval between neighboring antenna patterns ranges from 0.4 mm to 1 mm.

16. A portable terminal comprising:
a portable terminal body; and
a heat dissipating sheet,
wherein, the heat dissipating sheet comprises an antenna part formed into an antenna pattern having a predetermined line width; and a heat dissipating part disposed on a same plane as the antenna part and dissipating heat transferred from a heat source or distributing locally concentrated heat;
wherein the antenna part and the heat dissipating part are attached to an inner surface of a rear case or a back cover of the portable terminal body through an adhesive member,
wherein the heat dissipating part includes first and second heat dissipating parts, and the antenna pattern comprises a shape in the form of a square or rectangle, the shape is repeated in decreasing increments equal to the predetermined line width to define a plurality of the shapes each disposed inside another,
wherein the antenna part is disposed to surround an edge of the heat dissipating part or the antenna part is disposed at various locations relative to the heat dissipating part or the antenna part is locally disposed in a region of an entire area of the heat dissipating part.

* * * * *